(12) United States Patent
Stevanovic et al.

(10) Patent No.: US 7,327,024 B2
(45) Date of Patent: Feb. 5, 2008

(54) POWER MODULE, AND PHASE LEG ASSEMBLY

(75) Inventors: Ljubisa Dragoljub Stevanovic, Clifton Park, NY (US); Eladio Clementa Delgado, Burnt Hills, NY (US); Michael Joseph Schutten, Rotterdam, NY (US); Richard Alfred Beaupre, Pittsfield, MA (US); Michael Andrew De Rooij, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 408 days.

(21) Appl. No.: 10/998,798

(22) Filed: Nov. 24, 2004

(65) Prior Publication Data

US 2006/0108684 A1 May 25, 2006

(51) Int. Cl.
*H01L 23/52* (2006.01)

(52) U.S. Cl. .................. 257/691; 257/728; 257/723; 257/E23.079; 257/E23.142

(58) Field of Classification Search ............. 257/728, 257/706, 686, 698, 702, 709, 782, 735, 790, 257/723, E23.079, E23.106, E23.142, E23.153, 257/691
See application file for complete search history.

(56) References Cited

U.S. PATENT DOCUMENTS

| | | | |
|---|---|---|---|
| 5,424,579 A | | 6/1995 | Arai et al. |
| 5,463,252 A | * | 10/1995 | Jones et al. .................. 257/723 |
| 5,574,312 A | | 11/1996 | Bayerer et al. |
| 5,748,451 A | * | 5/1998 | Thompson et al. ......... 361/788 |
| 6,266,227 B1 | * | 7/2001 | Konushi et al. ......... 361/306.1 |
| 6,359,331 B1 | * | 3/2002 | Rinehart et al. ............ 257/691 |
| 6,377,461 B1 | | 4/2002 | Ozmat et al. |
| 6,381,161 B2 | | 4/2002 | Mourick |
| 6,584,681 B2 | * | 7/2003 | Lorenz et al. ................ 29/830 |
| 2002/0017714 A1 | * | 2/2002 | Choi .......................... 257/706 |
| 2004/0041253 A1 | | 3/2004 | Yamada et al. |

OTHER PUBLICATIONS

Mourick et al., "750 A, 75 V MOSFET Power Module with Sub-nHH Inductance," IEEE, Proceedings of the 14th International Symposium on Power Semiconductor Devices and ICs, Sep. 2, 2002, pp. 109-112.
Mauder et al., "Dynamic Behaviour and Ruggedness of Advanced Fast Switching IGBTs and Diodes," IEEE 2003, pp. 995-999.
ELCON Products International Company, Copyright 2000, 2001, "Hot Plug, High Current Dual Crown Clip Socket Connector".

* cited by examiner

*Primary Examiner*—Wai-Sing Louie
*Assistant Examiner*—Sarah K Salerno
(74) *Attorney, Agent, or Firm*—Penny A. Clarke; Patrick K. Patnode

(57) ABSTRACT

A power module includes a substrate that includes an upper layer, an electrical insulator and a thermal coupling layer. The upper layer includes an electrically conductive pattern and is configured for receiving power devices. The electrical insulator is disposed between the upper layer and the thermal coupling layer. The thermal coupling layer is configured for thermal coupling to a heat sink. The power module further includes at least one laminar interconnect that includes first and second electrically conductive layers and an insulating layer disposed between the first and second electrically conductive layers. The first electrically conductive layer of the laminar interconnect is electrically connected to the upper layer of the substrate. Electrical connections connect a top side of the power devices to the second electrically conductive layer of the laminar interconnect.

27 Claims, 12 Drawing Sheets

POWER MODULE, AND PHASE LEG ASSEMBLY

CROSS REFERENCE TO RELATED APPLICATIONS

This application is related to commonly assigned, copending U.S. patent application Ser. No. 10/998,707 entitled "Heat sink with microchannel cooling for power devices," Stevanovic et al., filed concurrently herewith, which patent application is incorporated by reference herein in its entirety.

BACKGROUND

The invention relates generally to power modules and, more particularly, to low inductance power modules for high power electronic applications.

Modem power semiconductor switches, such as silicon Insulated Gate Bipolar Transistors (IGBTs), are capable of switching at much higher frequencies than earlier designs. Their lower switching losses enable new applications requiring high frequency power conversion. However, inherent to these faster switching transitions are problems associated with the high parasitic inductance of conventional packaging technologies. In particular, the voltage overshoot that occurs when a power device is switched off is proportional to the product of the parasitic inductance and the slope of the IGBT current during the switching. Because of the faster switching transitions of the new IGBTs, reducing the parasitic inductance is more critical for the new generation of power devices, to avoid excessive voltage overshoots when switching the devices off. For example, a converter operating at 500V DC bus with a 50 nH parasitic inductance and a relatively fast switching transition of 5 A/ns would lead to a 50% voltage overshoot.

A conventional power module with screw type power terminals is shown in FIG. 11. The parasitic inductance of conventional power modules is approximately 20 nH and the phase-leg inductance of conventional designs is typically in excess of 50 nH. The screw type power terminal leads contribute a large share of the parasitic inductance, with the remainder contributed by wire bonds and the layout of the substrates. In addition to their high parasitic inductance, the non-symmetric layouts result in poor current sharing between power devices. Accordingly, the use of conventional power modules with the new generation of fast IGBT devices undesirably leads to significantly higher electrical stresses.

There have been previous attempts to design a low inductance power module. For example, Mourick et al., "750 A, 75 V MOSFET Power Module with Sub-nH Inductance," Sep. 2, 2002, IEEE, Proceedings of the $14^{th}$ International Symposium on Power Semiconductor Devices and ICs, describe a low inductance multi-chip interconnect featuring a number of conductive webs that enable three-dimensional interleaving with power devices. During each switching transition, opposing magnetic fields are created by the currents through the power devices and by the currents in the conductive webs. The opposing magnetic fields cancel, resulting in a 2 nH parasitic inductance for the interconnect. However, Mourick et al. fail to address the design of a low parasitic inductance interconnect at the module and converter level. Other shortcomings of this design include the increased cost due to the addition of conductive webs, as well as the overall complexity of the module assembly.

U.S. Pat. No. 5,424,579, Arai et al., entitled "Semiconductor device having low floating inductance," addresses device and substrate layout of a power module. However, Arai et al. feature a pair of conventional power terminals that keep the module inductance high. In addition, the layout is not symmetrical, which can lead to problems with dynamic and static current sharing between parallel power device die.

U.S. Pat. No. 5,574,312, Bayerer et al., entitled "Low-Inductance Power Semiconductor Module," vaguely describes a low-inductance dual power module built on two-sides of a liquid-cooled heat sink, and there are several aspects of this design that make it impractical. For example, FIG. 2 of Bayerer et al. indicates an asymmetrical layout of the phase-leg, with devices on one side of the heat sink presumably mounted with collector/drain/cathode down, and with devices on the other side being flip-mounted with emitter/source/anode down. In addition, soldering of power devices to a double-sided heat sink is less practical and may require the use of multiple solders having different melting temperatures. Moreover, the module uses a mid-point power terminal to connect devices from one side of the heat sink to the other. This connection would invariably lead to high parasitic inductance, adding to the total phase-leg inductance.

It would therefore be desirable to develop a low inductance power module for use in packaging power devices. It would further be desirable to develop low inductance phase leg modules, and a modular three-phase inverter with low parasitic inductance. It would further be desirable to reduce the contribution to the parasitic inductance associated with the power terminal leads and to provide for static and dynamic current sharing between parallel power devices.

BRIEF DESCRIPTION

Briefly, in accordance with one embodiment of the present invention, a power module is described. The power module includes at least one substrate that includes an upper layer, an electrical insulator and a thermal coupling layer. The upper layer includes at least one electrically conductive pattern and is configured for receiving, at least one power device. The electrical insulator is disposed between the upper layer and the thermal coupling layer. The thermal coupling layer is configured for thermal conduction to a heat sink. The power module further includes at least one laminar interconnect that includes a first electrically conductive layer, an insulating layer and a second electrically conductive layer. The insulating layer is disposed between the first and second electrically conductive layers, and the first electrically conductive layer of the laminar interconnect is electrically connected to the upper layer of the substrate. Electrical connections connect a top side of the at least one power device to the second electrically conductive layer of the laminar interconnect.

In accordance with another embodiment of the present invention, a power module assembly is described. The power module assembly includes a number of power modules, a number of receptacles configured to receive the laminar interconnects of respective ones of the power modules, and a back plane. The back plane includes a positive direct current (DC) power bus layer, an output layer, and a negative DC power bus layer. The receptacles are mounted on the back plane.

In accordance with another embodiment of the invention, a modular phase leg assembly is described. The modular phase leg assembly includes two power modules, and each of the power modules includes a heat sink, a substrate attached to the heat sink, and at least one switch that includes at least one transistor and at least one anti-parallel diode and is mounted on the electrically conductive pattern of the upper layer of the substrate. Each of the power modules further includes a housing, encasing the substrate and at least one switch, and a laminar interconnect. The first electrically conductive layer of the laminar interconnect is electrically connected to the upper layer of the substrate. Electrical connections connect an anode of the at least one anti-parallel diode to the second electrically conductive layer of the laminar interconnect.

In accordance with another embodiment of the invention, a modular three-phase inverter assembly is described. The modular three-phase inverter assembly includes six power modules, a number of receptacles configured to receive the laminar interconnects of respective ones of the power modules, and a back plane. The receptacles are mounted on the back plane. The power modules are arranged in three pairs, and each of the pairs corresponds to a phase leg.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
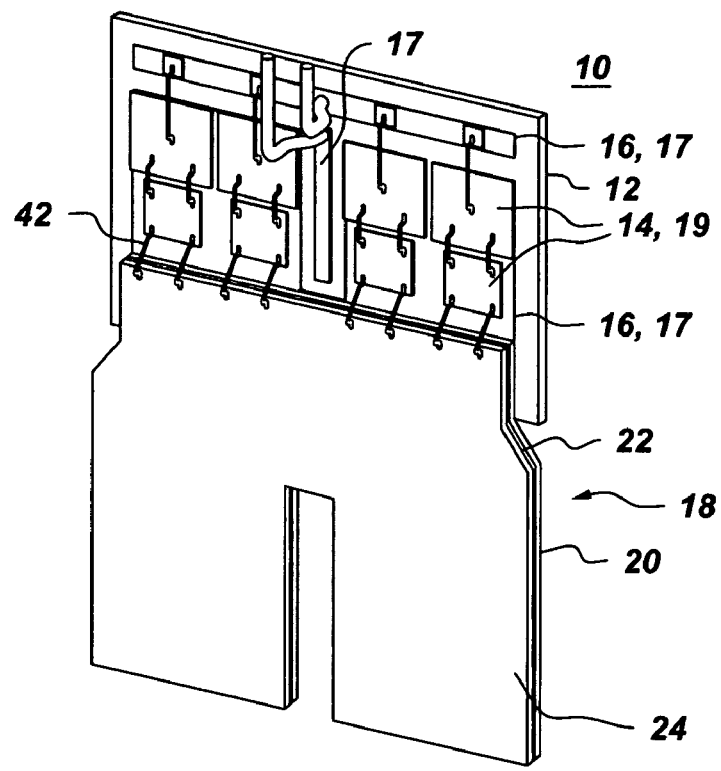
FIG. 1 illustrates a single switch power module embodiment of the invention using wire bonds.
Figure 3:
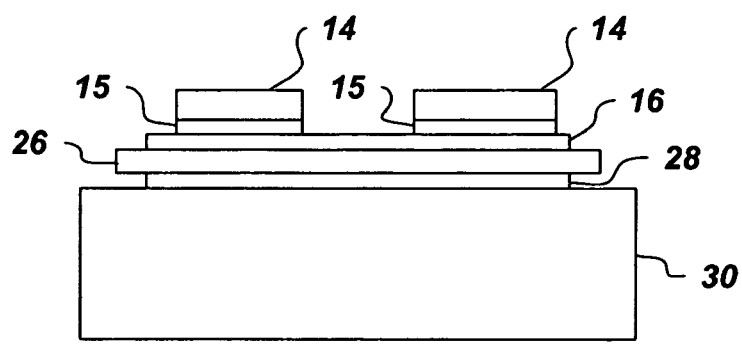
FIG. 3 is a side view of the single switch power module of FIG. 1 or 2 and schematically depicts an exemplary heat sink for the power module.

A single switch power module 10 embodiment of the invention is described with reference to FIGS. 1 and 3. Those skilled in the art will recognize that although power module 10 is described for a single switch configuration, power module 10 is equally applicable to other configurations. As shown, for example, in FIG. 1, power module 10 includes a substrate 12 with an upper layer 16 that includes at least one electrically conductive pattern 17 and is configured for receiving at least one power device 14. An exemplary electrically conductive pattern 17 is illustrated in FIG. 1. As indicated in FIG. 3, substrate 12 further includes an electrical insulator 26 and a thermal coupling layer 28. Electrical insulator 26 is disposed between upper layer 16 and thermal coupling layer 28. Thermal coupling layer 28 is configured for thermal coupling to a heat sink 30. Power module 10 further includes a laminar interconnect 18 that includes a first electrically conductive layer 20, an insulating layer 22 and a second electrically conductive layer 24, as shown for example in FIG. 1. The insulating layer 22 is disposed between first and second electrically conductive layers 20, 24. First electrically conductive layer 20 of laminar interconnect 18 is electrically connected to upper layer 16 of substrate 12. As shown for example in FIG. 1, electrical connections 42 connect a top side 19 of the power devices 14 to the second electrically conductive layer 24 of laminar interconnect 18. For the exemplary embodiment of FIG. 1 the electrical connections are wire bonds 42. Beneficially, by employing a laminar interconnect, and by connecting the substrate and laminar interconnect in this manner, the contribution of the interconnect to the overall parasitic inductance is reduced.

As used herein, the phrase "upper layer 16" includes a number of connected and/or disconnected conductive regions that form electrically conductive pattern 17 and are arranged in the same plane. Upper layer 16 is electrically conductive.

As used herein, the phrase "electrically connected to" encompasses connecting two elements by wiring, solder, power overlay, bonding, or other electrical connection means. According to a particular embodiment, upper layer 16 of substrate 12 is soldered to first conductive layer 20 of laminar interconnect 18. By connecting upper layer 16 to first conductive layer 20, the bottom side (not shown) of all power devices 14, such as the IGBT collector (or MOSFET drain) and diode cathode, are interconnected.

According to more particular embodiments, substrate 12 is formed of direct bonded copper (DBC) or an active metal braze (ANM) structure. Both DBC and AMB refer to a process for directly bonding copper layers to a ceramic substrate. Exemplary DBC or AMB substrates are formed of copper-ceramic-copper layers. DBC and AMB provide a convenient structure for substrate 12, and the use of the same conductive material (in this case, copper) on both sides of electrical insulator 26 provides thermal and mechanical stability.

According to a more particular embodiment, electrical insulator 26 is thermally conductive. Exemplary electrical insulators include aluminum-oxide ($AL_2O_3$), aluminum nitride (AlN), Beryllium Oxide (BeO) and silicon nitride ($Si_3N_4$), which are thermally conductive.

Exemplary insulating layers 22 include FR4, Kapton, other insulating polymers, and other insulating materials. According to a particular embodiment (not shown), insulating layer 22 extends beyond first and second conductive layers 20, 24 by a creepage distance to avoid electrical breakdown at the edge of laminar interconnect 18. As is known to those skilled in the art, a general rule for determining the creepage distance is 100 mils per Kilovolt, where a mil is one-thousandth of an inch. Exemplary conductive layers are formed of copper. Gold-bonded copper is also used to reduce oxidation.

Cooling is a design concern for power electronics. Many cooling techniques can be employed for power module 10, including flat-surface cooling techniques, examples of which include liquid cooling, micro-channel cooling, and conventional heat sinks. For the exemplary embodiment of FIG. 3, thermal coupling layer 28 is configured for coupling to a base plate 30. For example, thermal coupling layer 28 may be soldered or otherwise bonded to base plate 30. In particular, a DBC or AMB substrate 12 can be bonded to base plate 30 using any one of a number of techniques, including brazing, bonding, diffusion bonding, soldering, or pressure contact such as clamping. This provides a simple assembly process. For the exemplary embodiment of FIG. 3, power module 10 includes a heat sink 30, which comprises base plate 30. As shown, substrate 12 is attached to base plate 30. As discussed and illustrated in copending patent application, "Heat sink with microchannel cooling for power devices," for micro-channel cooling embodiments, heat sink 30 includes a number of micro-channels (not shown in this application). In one embodiment, the micro-channels are formed in conductive (for example, copper) layer 28 disposed between insulator 26 and base plate 30. In another embodiment, the micro-channels are formed in a ceramic insulator 26 which is disposed between upper layer 16 and either an optional conductive layer or base plate 30. Beneficially, heat sink 30 conducts heat away from power devices 14, in order to accommodate high power densities.

Figure 2:
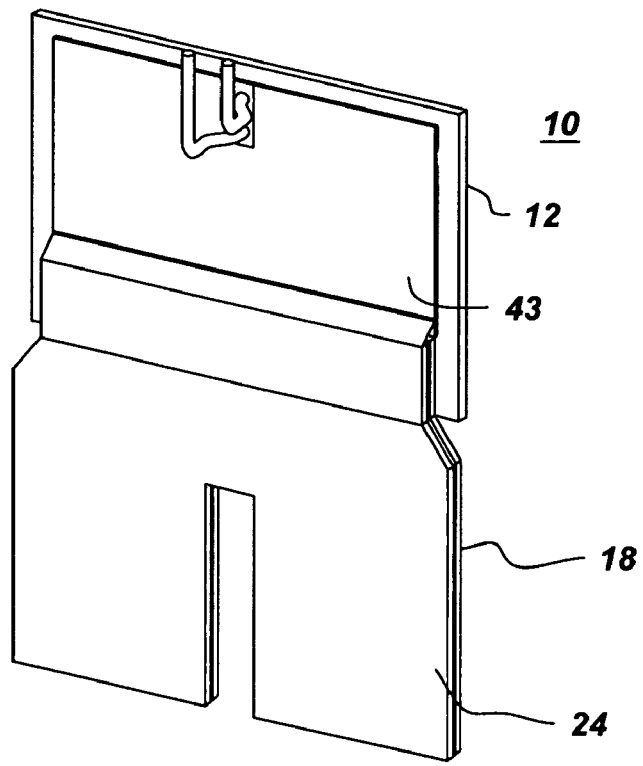
FIG. 2 illustrates another single switch power module embodiment of the invention using a power overlay.

For the exemplary embodiment of FIG. 1, power module 10 further includes a number of power devices 14 mounted on substrate 12, the power devices being electrically connected to upper layer 16 of substrate 12. Exemplary power devices include transistors, such as Insulated Gate Bipolar Transistors (IGBT), Metal Oxide Semiconductor Field Effect Transistors (MOSFET), Metal Semiconductor Field Effect Transistors (MESFET), and High Electron Mobility Transistors (HEMT), and diodes. Those skilled in the art will recognize that these are examples of power devices and that the invention is by no means limited to these examples. As noted above, electrical connections 42, 43 connect a top side 19 of power devices 14 to second electrically conductive layer 24 of laminar interconnect 18. For example, the power devices 14 may be mounted on substrate 12 via a solder layer 15, as indicated in FIG. 3. By connecting the top-sides of the power devices 14 to the second conductive layer 24 of the laminar interconnect 18, the IGBT emitter (or MOSFET source) and diode anode are interconnected. In addition, by connecting the top-sides of the power devices 14 to the second conductive layer 24 of laminar interconnect 18, the parasitic inductance is reduced. For the exemplary embodiment of FIG. 1, the electrical connections are wire bonds 42. Exemplary wire bonds include 10-15 mil aluminum wire bonds. Ribbon bonds are another type of electrical connection. FIG. 2 illustrates another embodiment for which the electrical connections comprise at least one power overlay 43, which overlays the top-sides (not shown in FIG. 2) of the power devices 14. Power overlays are described in commonly assigned U.S. Pat. No. 6,377,461, Ozmat et al, entitled "Power electronic module packaging," which patent is incorporated by reference herein in its entirety. Power overlays typically include at least one conductive and insulating layer and a number of vias (metal plugs). Exemplary insulating layers are formed of Kapton. Beneficially, power overlays are more robust than wire bonds and reduce the parasitic resistance and inductance relative to wire bonds.

According to a particular embodiment, electrical connections 17 and 42 or 43 are symmetric for static (steady-state) and dynamic (transient) current sharing. By symmetric, it is meant that the total length of the respective electrical connections between the power devices 14 and the first and second conductive layers 20 and 24 is substantially the same. In contrast, conventional power module designs provide current paths of varying lengths between power devices and the power terminals. Consequently, devices with shorter current paths are subject to greater stresses than are those power devices with longer current paths. The symmetrical arrangements of FIGS. 1 and 2, however, provide excellent static and dynamic current sharing between parallel power devices 14.

Figure 6:
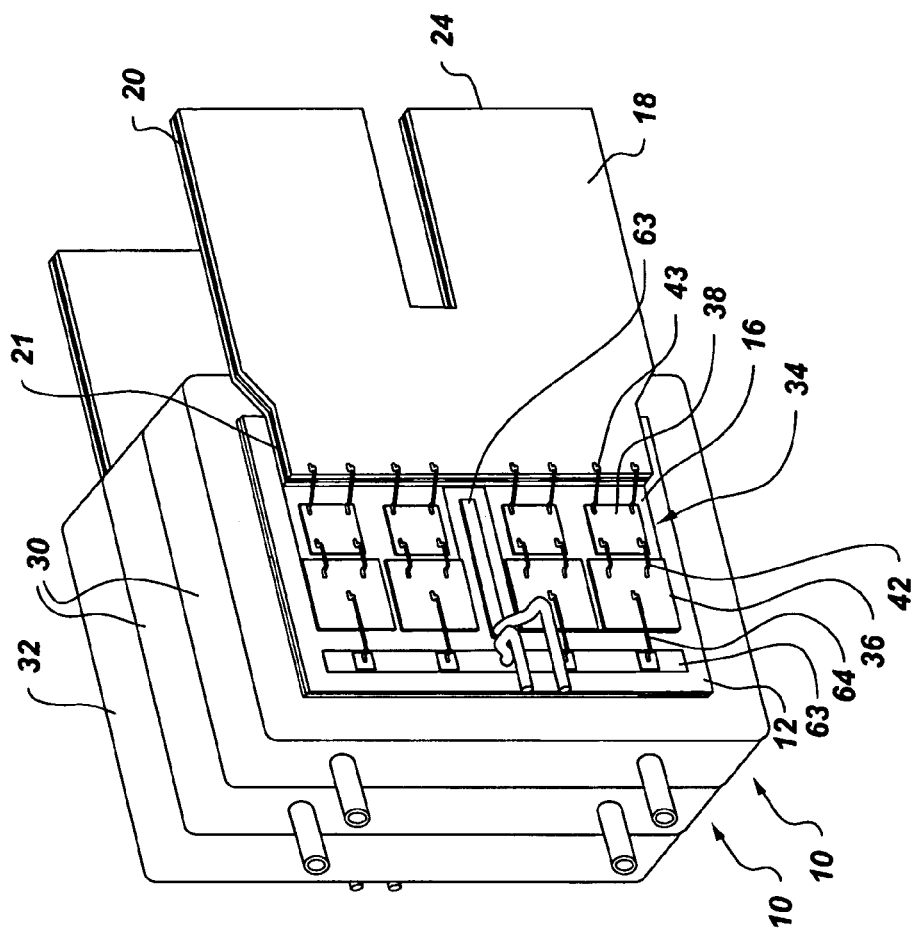
FIG. 6 illustrates a phase-leg embodiment of the invention, for clarity the housing is removed, revealing a number of power devices mounted on a substrate.

For the phase leg embodiment shown in FIG. 6, the power devices 14 include at least one transistor 36 and/or at least one anti-parallel diode 38 forming at least one switch 34. According to a particular embodiment, switch 34 is a 400 A switch and includes four (4) transistors and four (4) anti-parallel diodes. This configuration is merely exemplary, and switch 34 may have other current ratings and correspondingly, other transistor/anti-parallel diode configurations, depending on the desired application for switch 34. Switch 34 is mounted on electrically conductive pattern 17, as indicated in FIG. 6. The electrical connections are shown as wire bonds 42 in FIG. 6 and connect the anodes of diodes 38 to the second electrically conductive layer 24 of laminar interconnect 18. The electrical connections may also take the form of ribbon bonds or one or more power overlays 43, as discussed above with respect to FIG. 2.

Exemplary transistors include insulated gate bipolar transistors (IGBTs), which have emitters and collectors, and MOSFETs, which have sources and drains. For IGBTs, the electrical connections, which are shown in FIG. 6 as wire bonds 42, connect the IGBT emitters to the anodes of respective anti-parallel diodes 38. For MOSFETs, with internal anti-parallel body diodes, the electrical connections connect MOSFET sources to the second electrically conductive layer 24. In some designs, it is desirable to use MOSFETs with external high performance diodes, e.g., Schottky diode. In such designs, the electrical connections connect MOSFET sources to the anode of the respective anti-parallel diodes. Benefits of IGBTs include their low conduction loss characteristics, whereas MOSFETs feature faster switching speed. According to a particular example, power module 10 includes a number of transistors 36, with at least one of the transistors being a MOSFET and at least another of the transistors being an IGBT. More generally, power module 10 includes at least two different types of transistors 36. Similarly, for another embodiment, power module 10 includes at least two types of diodes 38. For example, power module 10 includes a number of anti-parallel diodes, with at least one of the diodes being a bipolar diode and at least another of the diodes being a Schottky diode.

According to a particular embodiment, switch 34 includes at least two transistors 36 and at least two anti-parallel diodes 38. For the phase leg embodiment of FIG. 6, switch 34 has four transistors 36 and 4 anti-parallel diodes 38 and is configured as a 400 A switch, for example. As discussed above with respect to FIG. 1, upper layer 16 of substrate 12 includes electrically conductive pattern 17, and switch 34 is disposed on pattern 17. Switch 34 further includes gate and return leads 63 formed on pattern 17. Electrical connections, shown in FIG. 6 as gate wire bonds 64, symmetrically connect each of the transistors 36 to the gate leads 63, which further improves static and dynamic current sharing between the power devices 14.

Figure 4:
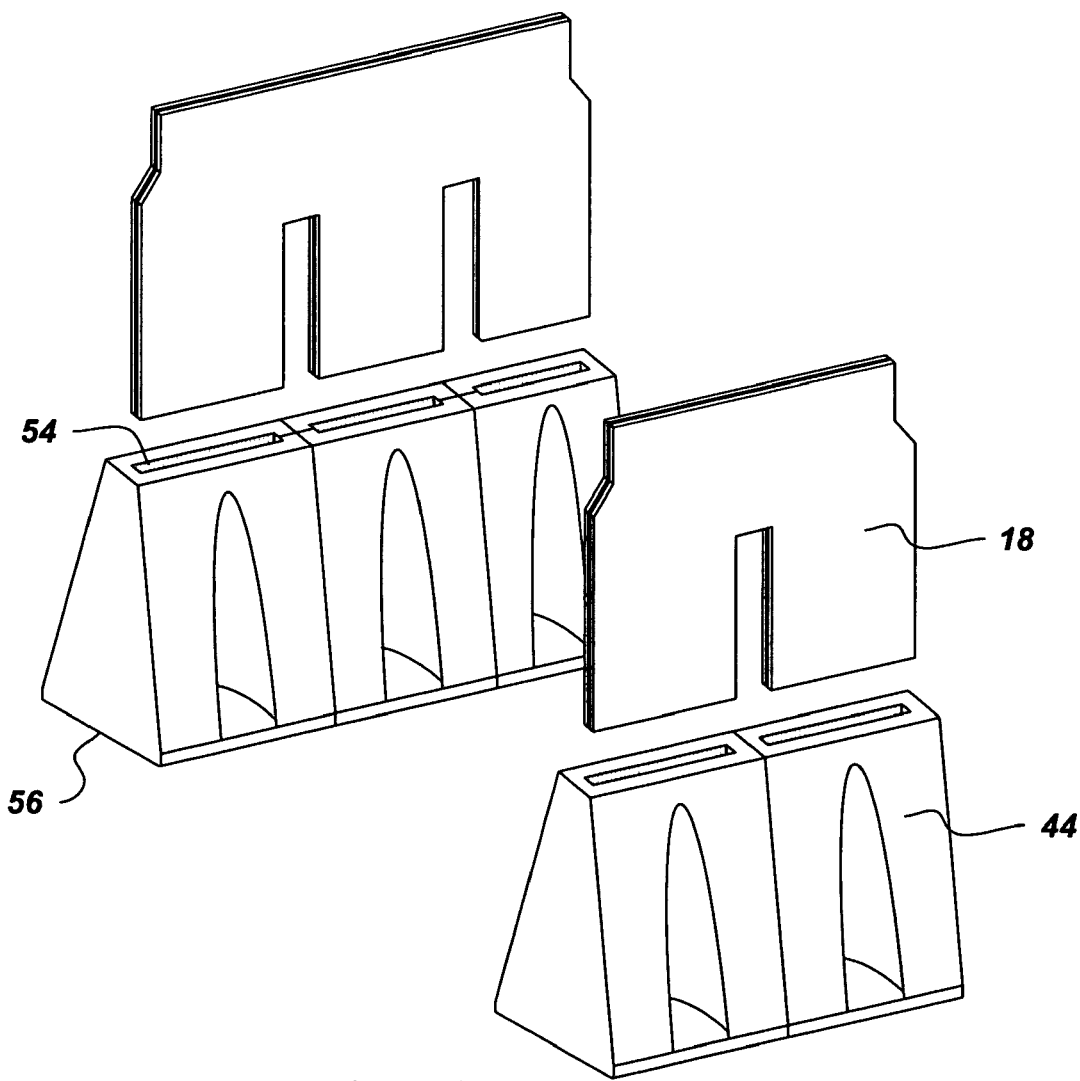
FIG. 4 shows two types of edge card connectors and receptacle configurations.
Figure 5:
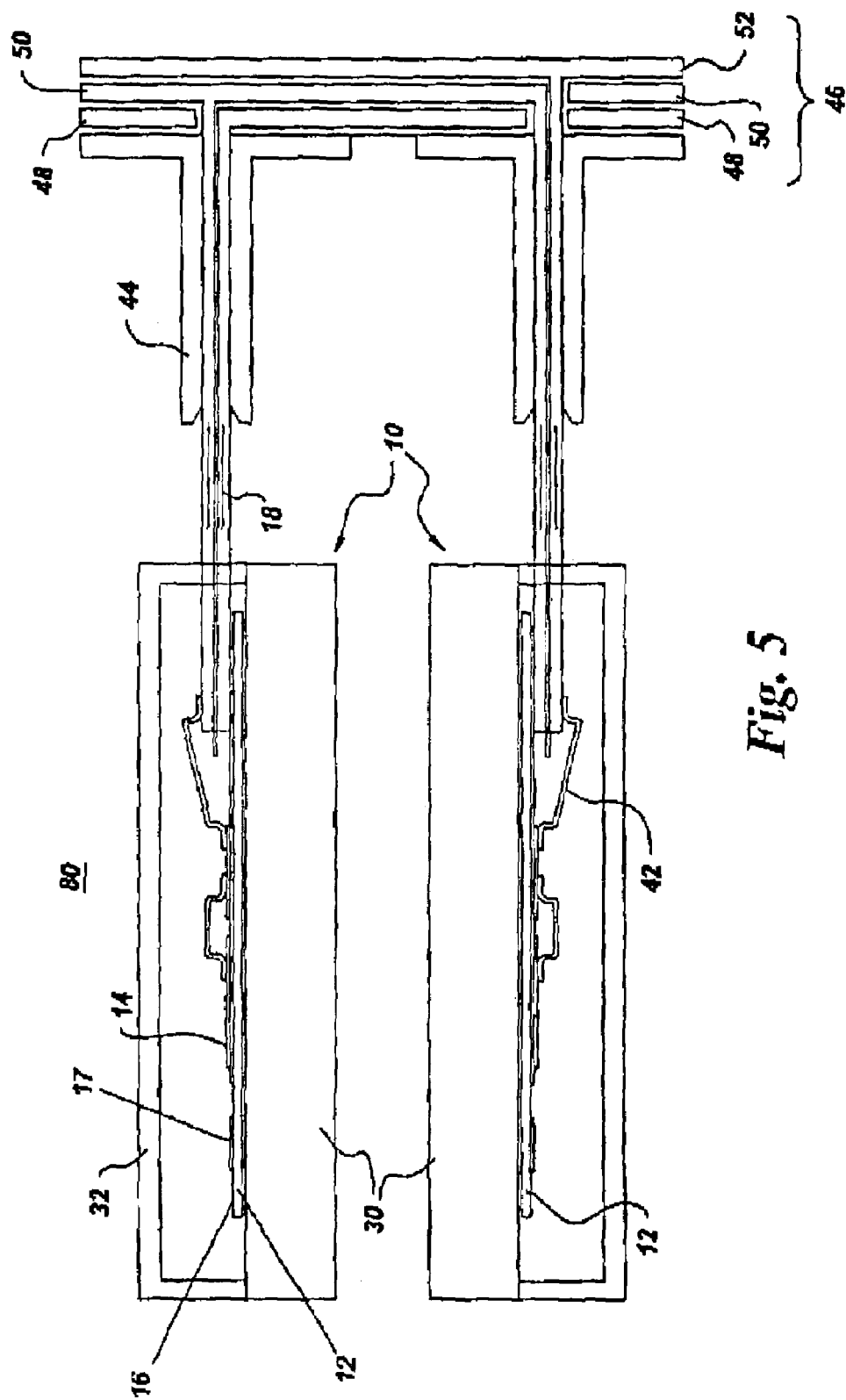
FIG. 5 is a cross-sectional view of a phase-leg assembly that includes two exemplary edge card connectors connected to respective receptacles, which are mounted on a back plane.

For the embodiments of FIGS. 1 and 2, laminar interconnect 18 is an edge card connector 18 configured for connecting to a receptacle 44 mounted on a back plane 46. Exemplary receptacles are shown in FIG. 4, while FIG. 5 shows two receptacles 44 mounted on back plane 46. Receptacles 44 have interior contact surfaces 54 for making contact with edge card connector 18 and exterior contact surface 56 for making contact with back plane 46. The contact surfaces may be smooth or scored, and exemplary contact surfaces are formed using copper or gold-plated copper. As indicated in FIG. 5, back plane 46 includes a positive direct current DC bus layer 48, an output layer 50, and a negative DC bus layer 52. Beneficially, by employing edge card connectors 18 and receptacles 44, the interconnect inductance is reduced relative to conventional power modules.

Figure 7:
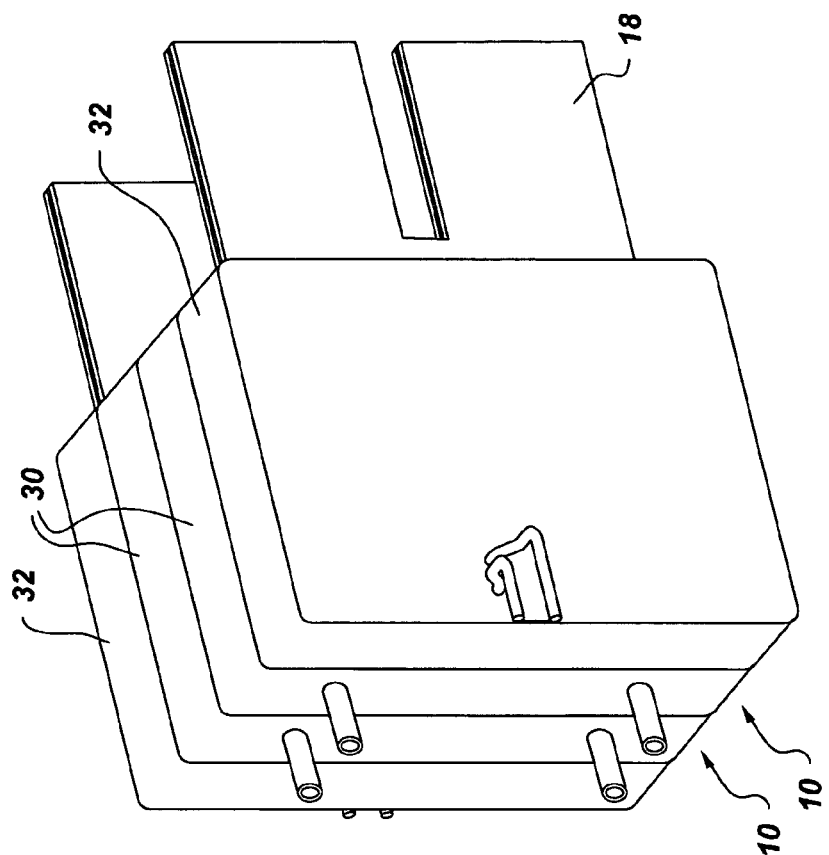
FIG. 7 shows the phase-leg of FIG. 6 with the housing in place.

In order to protect the power devices 14, the power module 10 further includes a housing 32 encasing substrate 12, according to a particular embodiment. FIG. 7 shows an exemplary housing 32.

Figure 12:
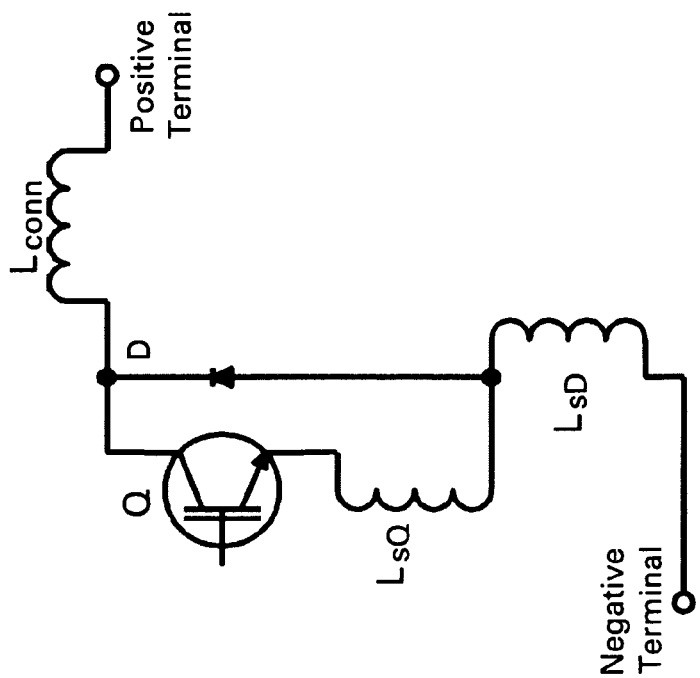
FIG. 12 is an equivalent circuit diagram of an exemplary power module and shows the location of the undesirable parasitic inductances.

An example single switch power module was simulated, and FIG. 12 is an equivalent circuit diagram for the single switch power module. The parasitic inductance of the example power module is calculated as follows:

$$L_{IGBT} = L_{conn} + L_{sD} + L_{sQ}, \text{ and}$$

$$L_{Diode} = L_{conn} + L_{sD}.$$

As used here, $L_{IGBT}$ is the package inductance when the IGBT is conducting, and $L_{Diode}$ is the package inductance when the anti-parallel diode is conducting. $L_{conn}$ is the contribution to the package inductance of the laminar interconnect that is shared between the IGBT and the anti-parallel diode. $L_{sQ}$ is the contribution to the package inductance associated with at least one wire bond 42 and the portion of electrically conductive pattern 17 between the IGBT die and the anti-parallel diode die. $L_{sD}$ is the contribution to the package inductance associated with at least one wire bond 42 and the portion of electrically conductive pattern 17 between the diode die and the laminar interconnect. In the example, the following parameter values were employed. The conductor width on the module was set to 51 mm, and the conductor width on the connector was selected to be 86 mm. A conductor spacing of 2.5 mm on the electrically conductive pattern 17 was used, and the spacing of the two conductive layers 16, 28 on the connector of 0.635 mm was selected. The heat-sink width and thickness were set to 51 mm and 5 mm, respectively. A wire bond diameter of 0.508 mm was used and simulations were performed at two frequencies: $f_s$=DC and 1 MHz. This is merely an example employed for the purpose of running a simulation for illustrative purposes only, and these values should not be viewed as limiting the invention in any way. For this example, the simulation results included: a total switch module inductance of 0.93 nH, a gate inductance of 9.2 nH at 1 MHz, a switch module capacitance of 406.4 pF, and a capacitance between the heat sink and collector plate of 207.5 pF.

A power module assembly 80 embodiment is described with respect to FIGS. 4-6. Those skilled in the art will recognize that although power module assembly 80 is illustrated for a phase-leg configuration, power module assembly 80 is equally applicable to other configurations. As shown, for example in FIG. 5, power module assembly 80 includes a number of power modules 10. As described above, exemplary power modules 10 include substrate 12, edge card connector 18, and electrical connections 42, 43. Exemplary power devices 14 for power modules 10 are discussed above. Power module assembly 80 further includes a number of receptacles 44 configured to receive respective ones of the edge card connectors 18. Exemplary receptacles are illustrated in FIG. 4. According to particular embodiments, the receptacles 44 have current ratings of at least one hundred Amperes (100 A) and more particularly, have current ratings of at least four hundred Amperes (400 A). Power module assembly 80 further includes a back plane 46, which has a positive direct current DC bus layer 48, an output layer 50, and a negative DC bus layer 52, as indicated in FIG. 5, for example. The receptacles 44 are mounted on back plane 46, as indicated in FIG. 6.

Figure 8:
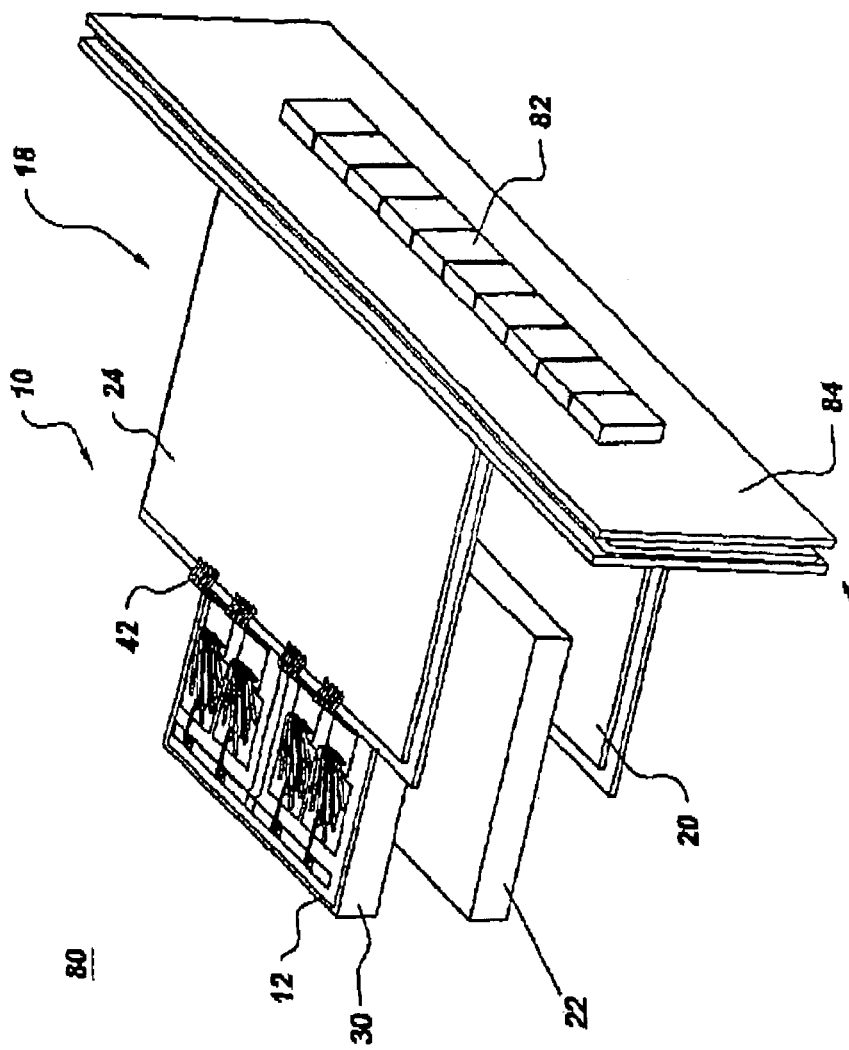
FIG. 8 is a perspective view of the phase-leg assembly of FIG. 5 with two single switch power modules and a low inductance capacitor mounted on a back-side of a back plane.
Figure 9:
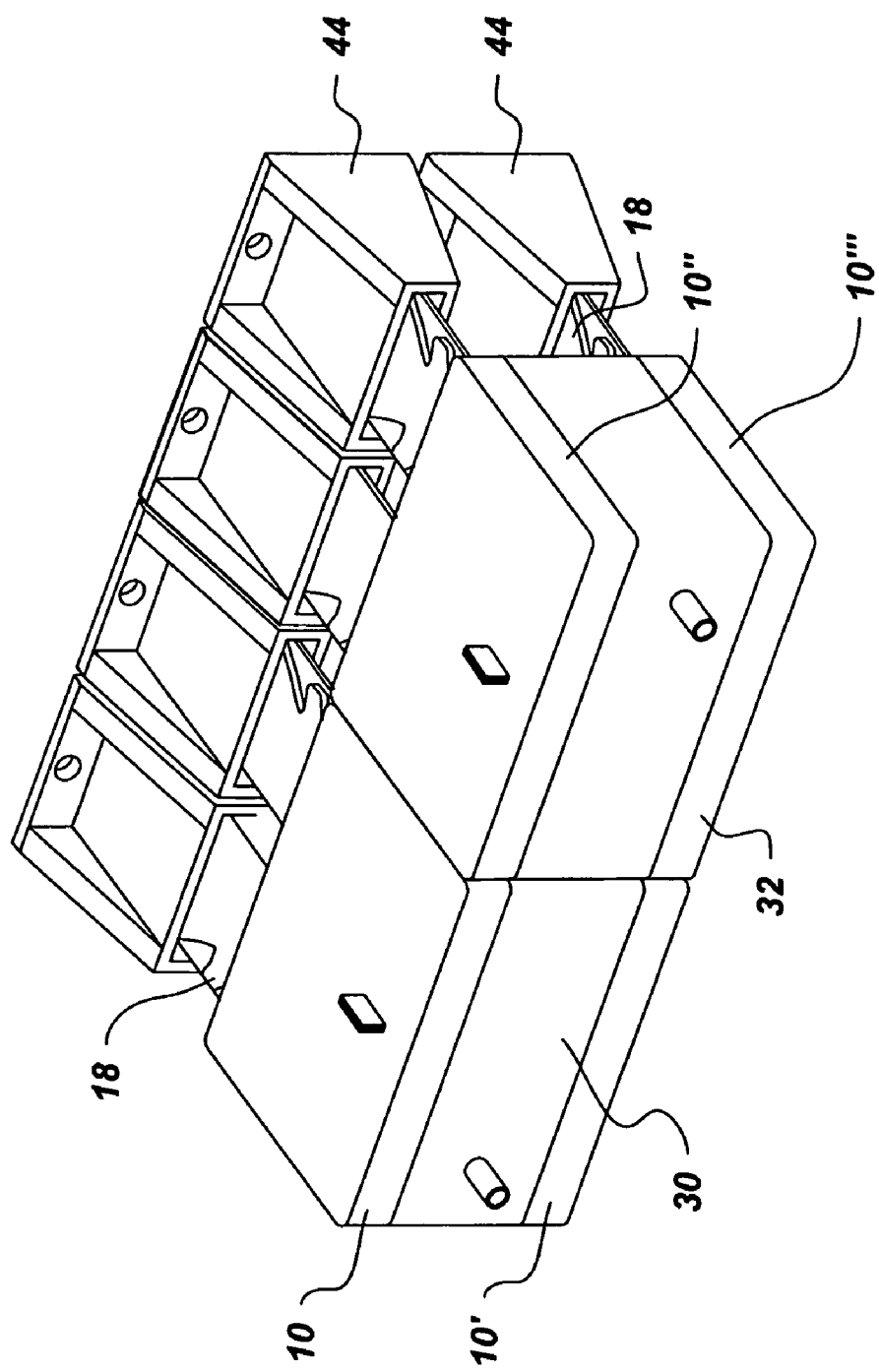
FIG. 9 illustrates a full bridge embodiment of the invention, where several power modules share a heat sink.

For the exemplary embodiment of FIGS. 5 and 8, power module assembly 80 includes two power modules 10 and two receptacles 44. As shown in FIGS. 5 and 8, power modules 10 are arranged such that their respective base plates 30 fare each other. Beneficially, this configuration provides a low parasitic inductance. Alternatively, for applications where control of the parasitic inductance is less critical and packaging constraints discourage the configuration shown in FIG. 5, power modules 10 and receptacles 44 can be arranged in a side-by-side configuration on back plane 46. For example, FIG. 9 shows a full bridge configuration with single switch power modules 10 arranged side-by-side. For the configuration of FIG. 9, the single switch power modules 10 share one heat sink 30. Alternatively, each of the single switch power modules 10 may also have a separate heat sink.

According to a particular embodiment, power module assembly 80 further includes at least one heat sink 30 for cooling power device(s) 14 mounted in the respective power modules 10. Heat sink 30 is discussed above with respect to FIG. 3. According to a more particular embodiment, electrical insulator 26 is thermally conductive.

According to particular embodiments, substrate 12 is formed of direct bonded copper (DBC) or an active metal braze (AMB). For the exemplary embodiment of FIG. 6, power module assembly 80 further includes a number of power devices 14 mounted on the electrically conductive pattern 17 of substrate 12. Exemplary electrical connections include wire or ribbon bonds 42 and a power overlay 43. For the exemplary embodiment of FIG. 6, the electrical connections take the form of wire bonds 42. As noted above, one benefit of the present invention is that the electrical connections may be symmetric for static and dynamic current sharing.

As noted above, it is desirable to reduce the parasitic inductance of the power module assembly. For the phase leg embodiment depicted in FIG. 8, the power module assembly 80 further includes at least one low-inductance capacitor 82. Exemplary low inductance capacitors 82 include multilayer ceramic capacitors and film capacitors. As shown, the one low inductance capacitor 82 is mounted on a back-side 84 of back plane 46. Beneficially, the use of low-inductance capacitors 82 further reduces the contribution to the parasitic inductance from the DC bus link.

Benefits of power module assembly 80 include a low parasitic inductance, modular structure, and scaleability to higher currents.

Figure 10:
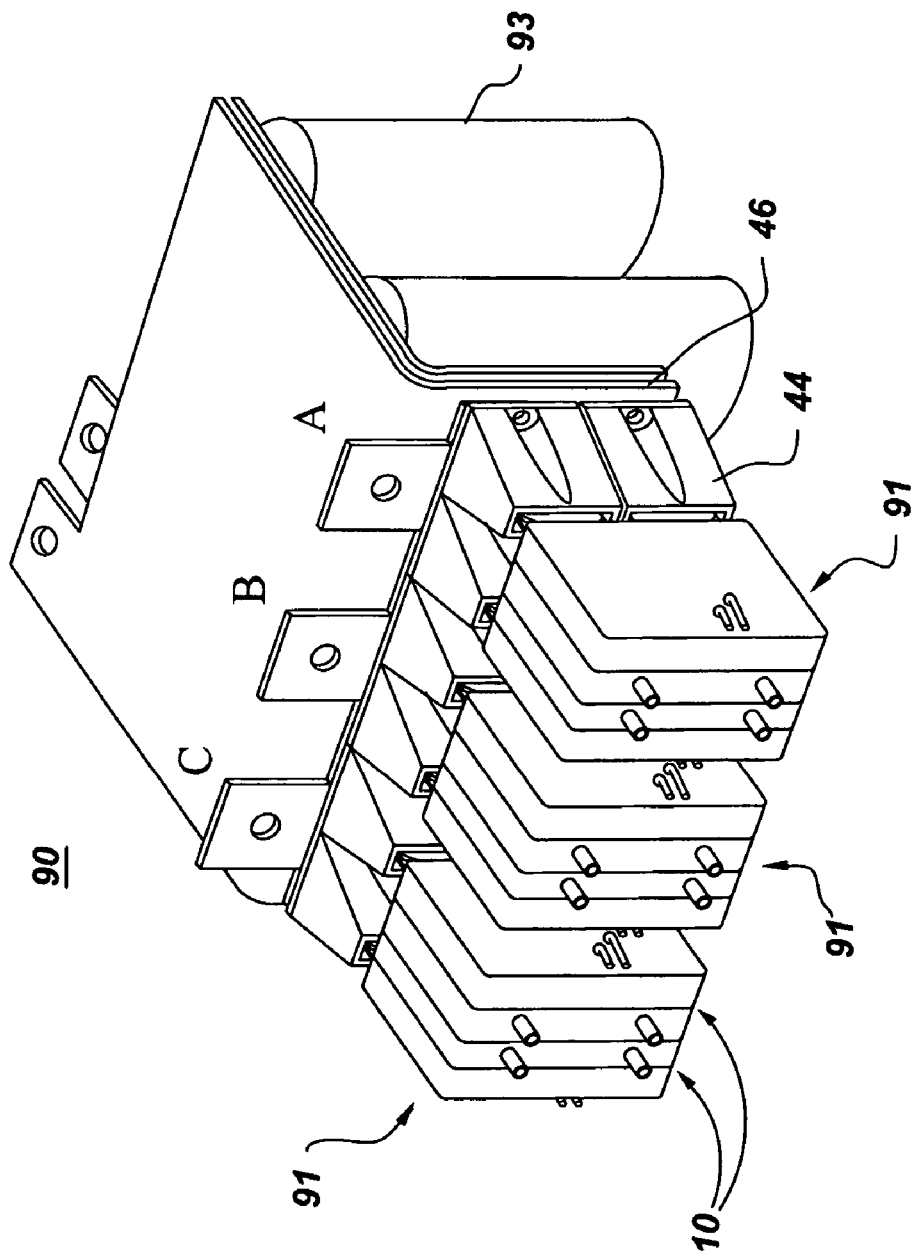
FIG. 10 shows a modular three-phase power converter assembly formed using three of the phase legs shown in FIG. 5.
Figure 11:
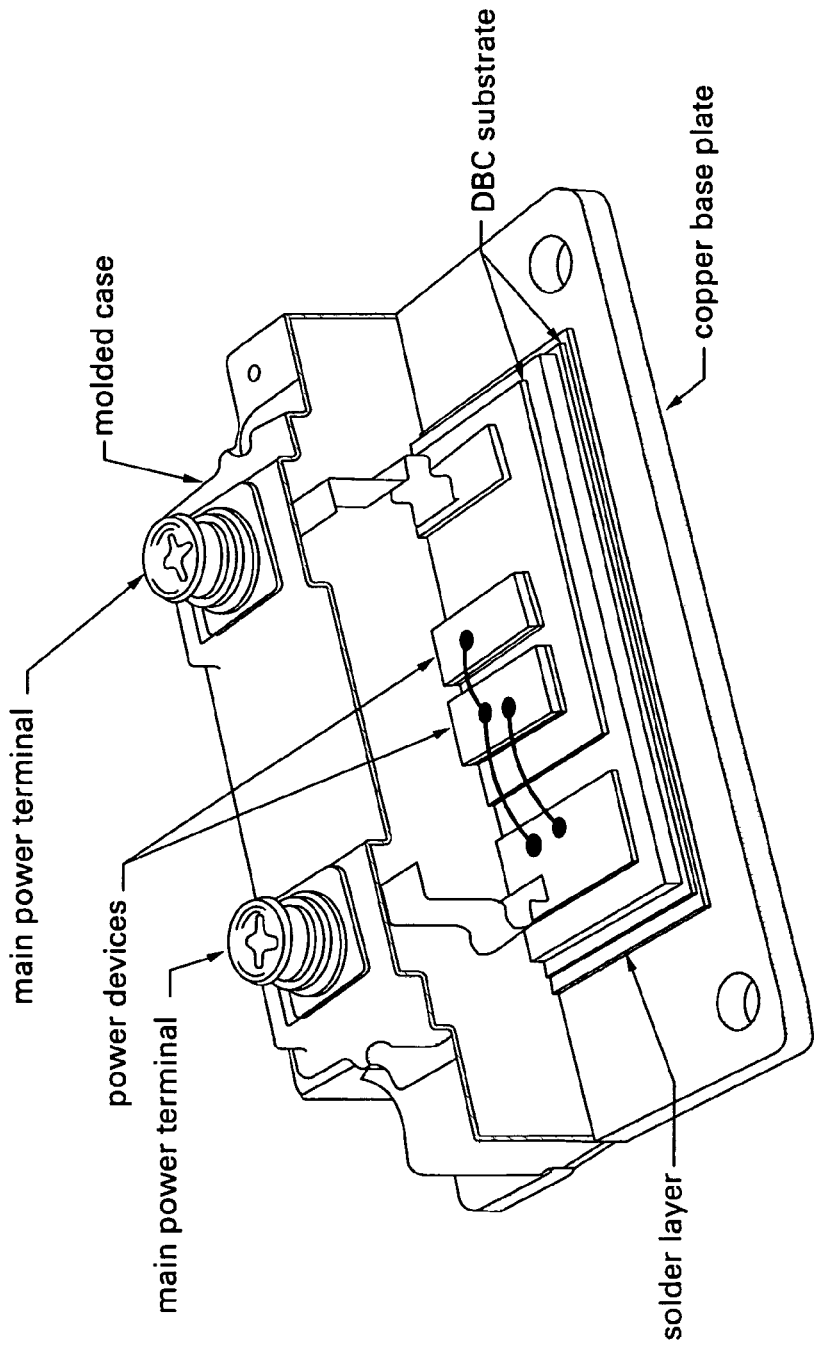
FIG. 11 depicts a conventional power module.
Figure 15:
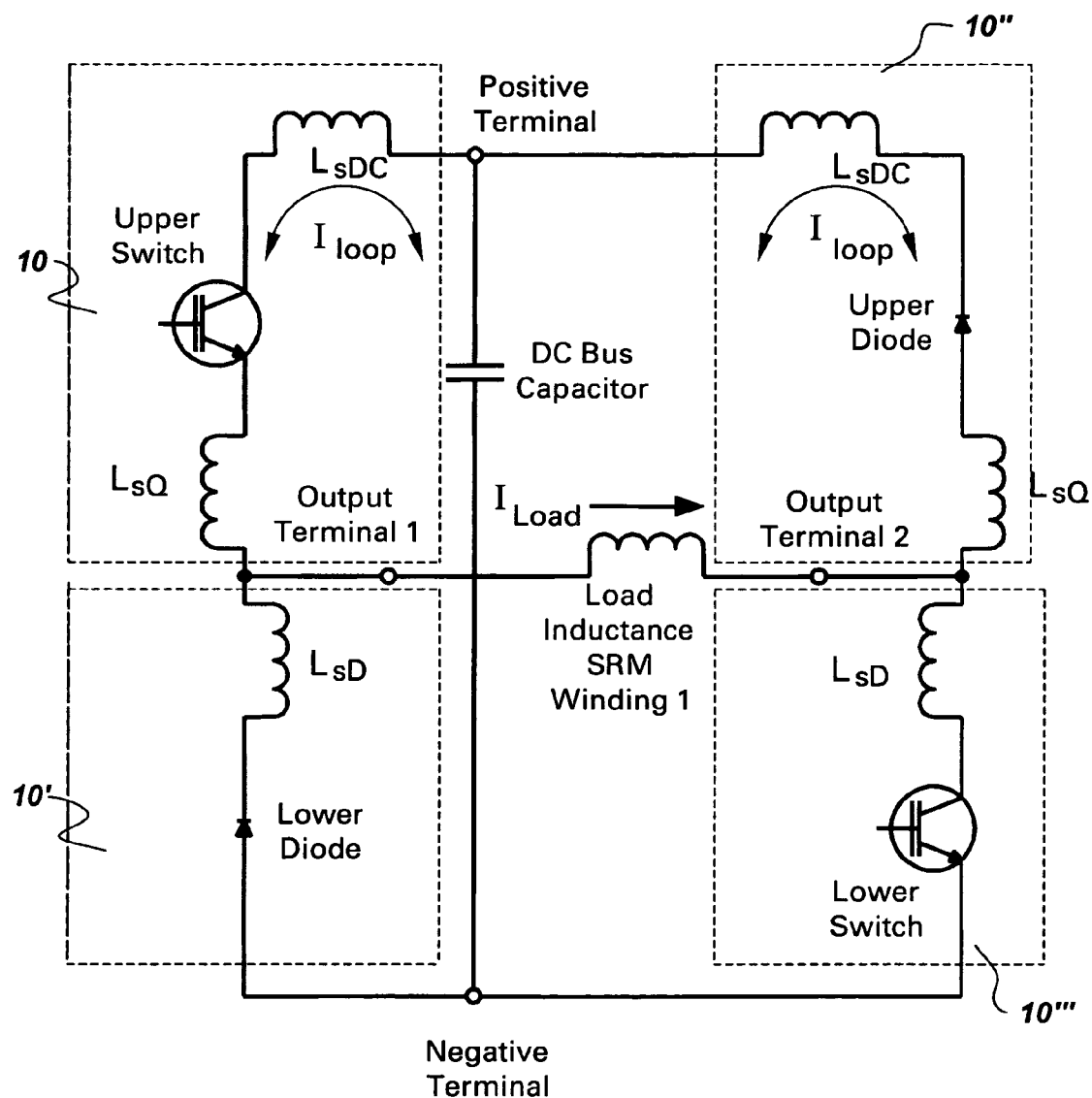
FIG. 15 is an equivalent circuit diagram for a switched reluctance motor (SRM) embodiment of the invention.

In another embodiment, power module assembly 80 is configured as a switch reluctance motor (SRM) drive. As shown for example in FIG. 15 for a two phase leg assembly SRM drive power circuit, power module assembly 80 includes at least four power modules 10, where at least two of the power modules are switch modules 10, and at least two of the power modules are diode modules 10. For this exemplary four power module 10 configuration, the SRM drive would be configured to drive one winding of a SRM. The SRM drive has at least two phase legs, each of the phase legs comprising at least one of the switch modules and at least one of the diode modules. As indicated, the switch modules include at least one transistor, for example an IGBT, and the diode modules include at least one diode. The power modules 10 are arranged in pairs along the back plane 46, as indicated in FIG. 8 for the case of two power modules. However, for the SRM embodiment shown in FIG. 15, four power modules 10 are arranged in two pairs, each pair consisting of the switch and the diode module from the same phase leg. FIG. 9 illustrates one possible physical configuration of the SRM embodiment of FIG. 15. Alternatively, the SRM drive can be configured as shown in FIG. 10. The SRM embodiment can be generalized to SRM drive power circuits employing other numbers of phase legs. More generally, a SRM includes N windings, where N is an integer, and the corresponding SRM drive includes four power modules 10 (two switch modules 10 two diode modules 10) arranged as two phase legs to drive each of the windings. For example, for a three winding SRM, the SRM drive includes twelve (12) power modules (six switch modules and six diode modules) arranged as six phase legs, with the three pairs of phase legs driving the respective three windings. A three phase SRM inverter would be similar to the standard three-phase inverter depicted in FIG. 10, with the difference of additional alternating pairs of modules comprising a switch module and a diode module, such that the topology of FIG. 15 is repeated for each phase of the SRM inverter.

The power modules 10 can advantageously be combined to form a modular phase leg assembly 80, which is a specific embodiment of the more general power module assembly 80. A modular phase leg assembly 80 is discussed with reference to FIGS. 5-8 and includes two power modules 10, which are described above. According to a particular embodiment and as shown for example, in FIGS. 6 and 7, the power modules 10 are stacked together such that the base plate 30 of one of the power modules 10 faces the base plate 30 of the other power module 10. Beneficially, by arranging the power modules back-to-back as indicated in FIG. 6 and 7, the parasitic inductance due to the back plane is reduced. FIG. 9 shows another arrangement of power modules 10, in which single switch modules 10 form a full bridge. For the arrangement of FIG. 9, the modules 10 share a single heat sink 30. Alternatively, each of the single switch power modules 10 may also have a separate heat sink.

Figure 13:
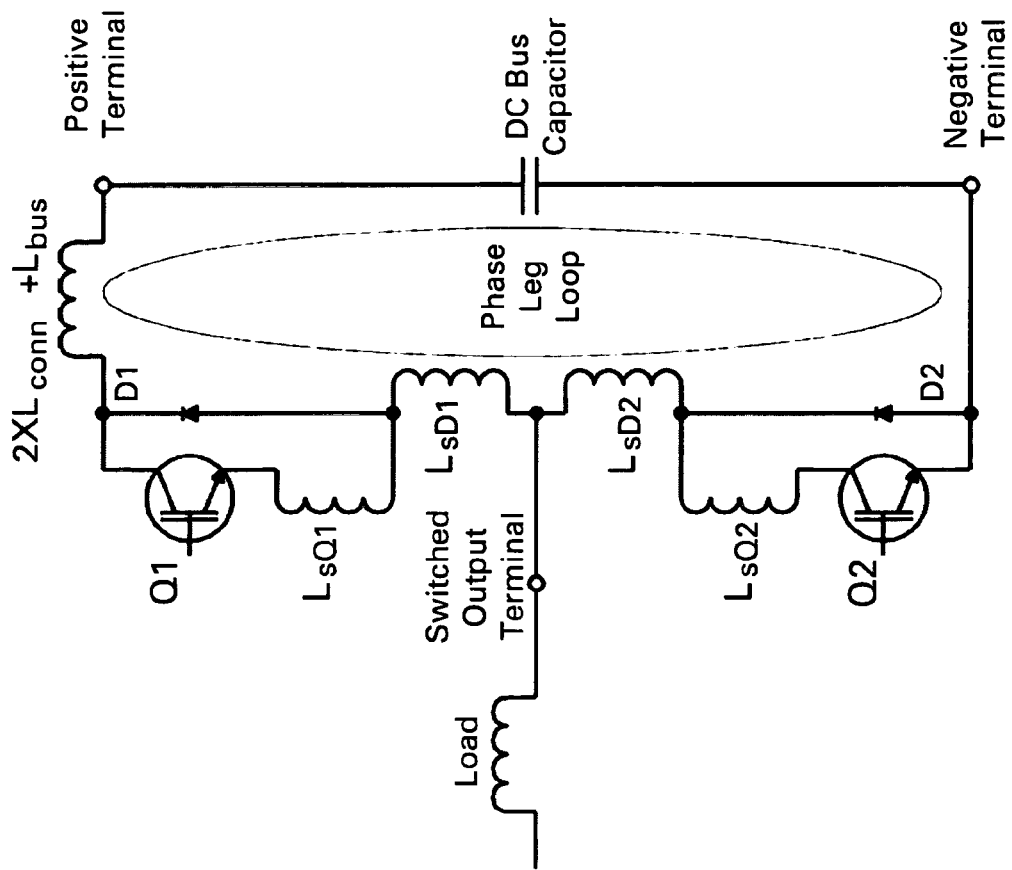
FIG. 13 is an equivalent circuit diagram of an exemplary phase leg assembly and shows the location of the undesirable parasitic inductances.

An example modular phase leg assembly was simulated, and FIG. 13 is a circuit diagram for an exemplary phase leg assembly. The parasitic inductance of the phase leg assembly is calculated as follows:

$$L_{swL+} = L_{conn} + \frac{L_{Bus}}{2} + L_{sD1} + L_{sQ1},$$

$$L_{dL+} = L_{conn} + \frac{L_{Bus}}{2} + L_{sD2},$$

-continued $$L_{swL-} = L_{conn} + \frac{L_{Bus}}{2} + L_{sD2} + L_{sQ2}, \text{ and}$$

$$L_{dL-} = L_{conn} + \frac{L_{Bus}}{2} + L_{sD1}.$$

As used here, $L_{swL+}$ is the parasitic inductance for the upper switch path between the output terminal and the positive terminal, $L_{dL+}$ is the parasitic inductance for the upper diode path between the output terminal and the positive terminal, $L_{swL-}$ is the parasitic inductance for the lower switch path between the output terminal and the negative terminal, and $L_{dL-}$ is the parasitic inductance for the lower diode path between the output terminal and the negative terminal. $L_{Bus}$ is the parasitic inductance of the back plane, and $L_{conn}$ is the parasitic inductance of the laminar interconnect. $L_{sQ1}$ ($L_{sQ2}$) is the contribution to the package inductance associated with the wire bond interconnection between the switch Q1 (Q2) die and the anti-parallel diode D1 (D2) die. $L_{sD1}$ ($L_{sD2}$) is the contribution to the package inductance associated with at least one wire bond 42 and the portion of electrically conductive pattern 17 between the diode D1 (D2) die and the laminar interconnect. In the example, the following parameter values were employed. The conductor width on the module was set to 51 mm, and the conductor width on the connector was selected to be 56 mm. A conductor spacing of 2.5 mm on the electrically conductive pattern 17 was used, and the spacing of the two conductive layers on the connector of 0.635 mm was selected. A heat-sink width of 40 mm was used. This is merely an example employed for the purpose of running a simulation for comparative purposes only, and these values should not be viewed as limiting the invention in any way. For this example, the simulation yielded a phase-leg loop inductance—the total loop inductance from positive to negative terminal of low inductance DC bus capacitor—of 2.78 nH, for the back-to-back configuration of FIG. 8. In comparison, two identical power modules 10 in a side-by-side arrangement yielded a much higher parasitic inductance of 36.66 nH for these parameter values. This clearly illustrates the importance of stacking of power modules such that the base plate 30 of one of the power modules 10 faces the base plate 30 of the other power module 10, as shown for example in FIGS. 5, 6, 7 and 8.

As shown for example in FIGS. 5 and 8, modular phase leg assembly 80 also includes at least two receptacles 44 configured to receive respective ones of the laminar interconnects 18 and back plane 46. The receptacles 44 are mounted on back plane 46. At least one low-inductance capacitor 82 is mounted on a back-side 84 of back plane 46. Exemplary low-inductance capacitors 82 include multilayer ceramic capacitors and film capacitors.

Figure 14:
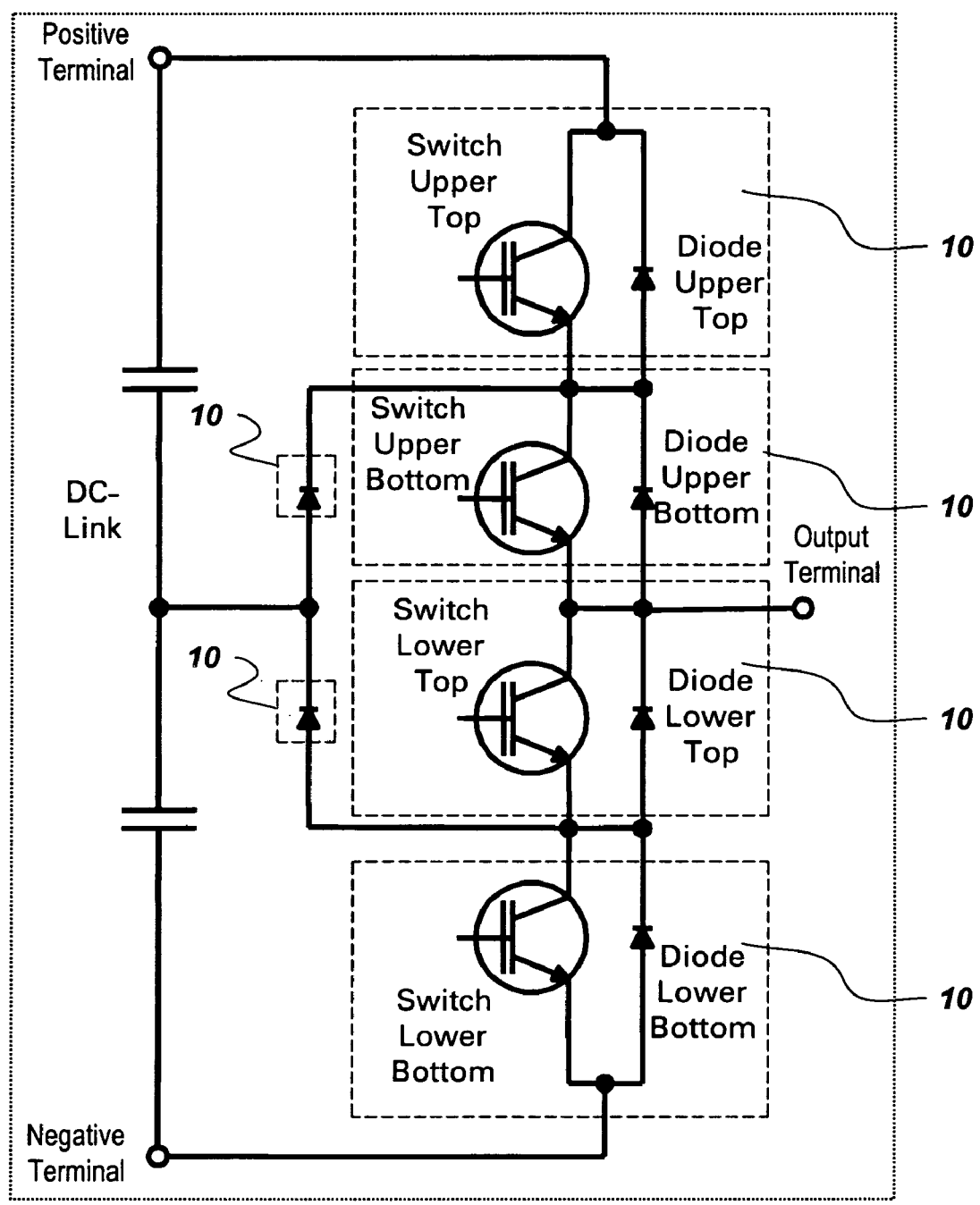
FIG. 14 is an equivalent circuit diagram of a three-level phase leg assembly, where the schematic excludes parasitic elements.

FIG. 14 is an equivalent circuit diagram of a three-level phase leg assembly, and the schematic excludes parasitic elements. As shown, power module assembly 80 includes six power modules 10, where four of the power modules 10 are switch modules, and two of the power modules 10 are diode modules. For this embodiment, the power modules 10 are arranged as a three level phase leg. According to a more particular embodiment, power module assembly 80 further includes six receptacles 44 arranged vertically on the back plane 46 (along the y direction shown in FIG. 8), with the power modules 10 stacked in the y direction.

The power modules 10 can advantageously be combined to form a modular three-phase inverter assembly 90 that includes six power modules 10, which are described above. An exemplary modular three-phase inverter assembly 90 is illustrated in FIG. 10. As shown in FIG. 10, the power modules 10 are arranged in three pairs, with each of the pairs corresponding to a phase leg 91. The phase legs 91 are exemplarily labeled A, B and C in FIG. 10. To reduce the inductance of the phase leg loops, the power modules 10 forming a pair are stacked together such that the base plate 30 of one of the power modules 10 faces the base plate 30 of the other power module 10, as shown for example in FIGS. 6, 7 and 10. As shown in FIG. 10, modular three-phase inverter assembly 90 also includes at least six receptacles 44 configured to receive respective laminar interconnects 18, and back plane 46. Receptacles 44 are mounted on back plane 46.

Although the exemplary three-phase inverter assembly 90 shown in FIG. 10 includes electrolytic capacitors 93 connected to the DC bus, in order to reduce the DC bus contribution to the parasitic inductance, low inductance capacitors 82 may be employed. Although not shown in FIG. 10, low inductance capacitors 82 are discussed above with reference to FIG. 8. According to a particular embodiment, modular three-phase inverter assembly 90 further includes at least one low-inductance capacitor 82, such as a multilayer ceramic capacitor or a film capacitor. The low inductance capacitor is mounted on a back side 84 of back plane 46, as shown for example in FIG. 8.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power module assembly comprising:
a plurality of power modules, each of said power modules comprising:
a substrate comprising an upper layer, an electrical insulator and a thermal coupling layer, wherein said upper layer comprises at least one electrically conductive pattern and is configured for receiving at least one power device, wherein said electrical insulator is disposed between said upper layer and said thermal coupling layer, and wherein said thermal coupling layer is configured for thermal coupling to a base plate,
an edge card connector comprising a first electrically conductive layer, an insulating layer and a second electrically conductive layer, wherein said insulating layer is disposed between said first and second electrically conductive layers, and wherein said first electrically conductive layer of said edge card connector is electrically connected to said upper layer of said substrate, and
a plurality of electrical connections connecting a top side of the at least one power device to said second electrically conductive layer of said edge card connector;
a plurality of receptacles configured to receive respective ones of said edge card connectors; and
a back plane comprising a positive direct current (DC) bus layer, an output layer, and a negative DC bus layer, wherein said receptacles are mounted on said back plane.

2. The power module assembly of claim 1, further comprising at least one heat sink for cooling said at least one power device mounted in the respective one of said power modules, wherein said heat sink comprises said base plate, and wherein said electrical insulator is thermally conductive.

3. The power module assembly of claim 1, wherein each of said substrates comprises direct bonded copper (DBC), wherein each of said power modules further comprises a plurality of power devices mounted on said electrically conductive pattern of said substrate, and wherein said electrical connections are selected from the group consisting of wire bonds, ribbon bonds, a power overlay, and combinations thereof.

4. The power module assembly of claim 3, wherein said electrical connections are symmetric for static and dynamic current sharing.

5. The power module assembly of claim 1, further comprising at least one low-inductance capacitor selected from the group consisting of a multilayer ceramic capacitor and a film capacitor, wherein said at least one low inductance capacitor is mounted on a back side of said back plane.

6. The power module assembly of claim 1, wherein each of said power modules comprises a base plate thermally coupled to said thermal coupling layer of said substrate, wherein said power module assembly comprises at least two power modules and at least two receptacles, wherein two of said power modules are arranged such that their respective base plates face each other.

7. The power module assembly of claim 1, comprising at least two power modules and at least two receptacles, wherein said two power modules and said two receptacles are arranged in a side-by-side configuration.

8. The power module assembly of claim 7, further comprising a heat sink, wherein each of said thermal coupling layers of said power modules is thermally coupled to said heat sink.

9. The power module assembly of claim 1, comprising six power modules and six receptacles, wherein four of said power modules comprise switch modules, wherein two of said power modules comprise diode modules, and wherein said power modules are arranged as a three level phase leg.

10. The power module assembly of claim 1, wherein each of said power modules comprises at least one transistor and at least one anti-parallel diode forming at least one switch, wherein said at least one switch is mounted on said electrically conductive pattern, and wherein said electrical connections connect an anode of said diode to said second electrically conductive layer of said laminar interconnect.

11. The power module assembly of claim 10, wherein said at least one transistor comprises an insulated gate bipolar transistor (IGBT) comprising a collector and an emitter, and wherein said electrical connections connect said emitter to said anode of said anti-parallel diode.

12. The power module assembly of claim 10, wherein said at least one transistor comprises a MOSFET comprising a source and a drain, and wherein said electrical connections connect said source to said anode of said anti-parallel diode.

13. The power module assembly of claim 10, wherein each of said at least one switches comprises at least two transistors and at least two anti-parallel diodes, wherein said switch is disposed on said electrically conductive pattern and further comprises a gate formed on said electrically conductive pattern, and wherein said electrical connections symmetrically connect each of said transistors to said gate.

14. The power module assembly of claim 1, wherein said power devices comprise at least one MOSFET comprising a source and a drain, wherein said drain is soldered onto said electrically conductive pattern, and wherein said electrical connections connect said source to said upper layer of said laminar interconnect.

15. The power module assembly of claim 1, wherein each of said power modules further comprises a housing encasing said substrate and said at least one switch.

16. The power module assembly of claim 1, wherein each of said substrates comprises active metal braze (AMB), wherein each of said power modules further comprises a plurality of power devices mounted on said electrically conductive pattern of said substrate, and wherein said electrical connections are selected from the group consisting of wire bonds, ribbon bonds, a power overlay, and combinations thereof.

17. The power module assembly of claim 16, wherein said electrical connections are symmetric for static and dynamic current sharing.

18. The power module assembly of claim 1 configured as a switch reluctance motor (SRM) drive and comprising at least four power modules, wherein at least two of said power modules are switch modules, wherein at least two of said power modules are diode modules, wherein said SRM drive comprises at least two phase legs, each of said phase legs comprising at least one of said switch modules and at least one of said diode modules.

19. The power module assembly of claim 18, wherein the SRM comprises N windings, where N is an integer, and said power module assembly configured as the SRM drive comprises two switch modules and two diode modules for each one of the respective N windings, wherein said SRM drive comprises 2N phase legs, each of said phase legs comprising at least one of said switch modules and at least one of said diode modules, and wherein two of said phase legs drive a respective one of the SRM windings.

20. A modular phase leg assembly comprising two power modules, each of said power modules comprising:
a heat sink,
a substrate comprising an upper layer, an electrical insulator and a thermal coupling layer, wherein said upper layer comprises at least one electrically conductive pattern, wherein said electrical insulator is disposed between said upper layer and said thermal coupling layer, wherein said substrate is attached to said heat sink, and wherein said thermal coupling layer is configured for thermally coupling to said heat sink, and
at least one switch comprising at least one transistor and at least one anti-parallel diode, wherein said at least one switch is mounted on said electrically conductive pattern;
a housing encasing said substrate and said at least one switch;
a laminar interconnect comprising a first electrically conductive layer, an insulating layer and a second electrically conductive layer, wherein said insulating layer is disposed between said first and second electrically conductive layers, wherein said first electrically conductive layer of said laminar interconnect is electrically connected to said upper layer of said substrate; and
a plurality of electrical connections connecting an anode of said at least one anti-parallel diode to said second electrically conductive layer of said laminar interconnect.

21. The modular phase leg assembly of claim 20, wherein each of said heat sinks comprises a base plate, and wherein said power modules are stacked together such that said base plate of one of said power modules faces said base plate of the other of said power modules.

22. The modular phase leg assembly of claim 20, wherein said power modules are arranged side-by-side.

23. The modular phase leg assembly of claim 20, wherein each of said switches comprises at least two transistors and at least two anti-parallel diodes, wherein each of said switches is disposed on a respective one of said electrically conductive patterns, wherein each of said switches further comprises a gate formed on the respective one of said electrically conductive patterns, and wherein said electrical connections symmetrically connect each of said transistors to a respective one of said gates.

24. The modular phase leg assembly of claim 20, wherein each of said substrates comprises direct bonded copper, and wherein each of said laminar interconnects comprises an edge card connector, said modular phase leg assembly further comprising:
two receptacles configured to receive respective ones of said edge card connectors;
a back plane comprising a positive direct current (DC) bus layer, an output layer, and a negative DC bus layer, wherein said receptacles are mounted on said back plane; and
at least one low-inductance capacitor selected from the group consisting of a multilayer ceramic capacitor and a film capacitor, wherein said at least one low inductance capacitor is mounted on a back side of said back plane.

25. A modular three phase inverter assembly comprising six power modules, each of said power modules comprising:
a heat sink,
a substrate comprising an upper layer, an electrical insulator and a thermal coupling layer, wherein said upper layer comprises an electrically conductive pattern, wherein said electrical insulator is disposed between said upper layer and said thermally conductive coupling layer, wherein said substrate is attached to said heat sink, wherein said thermal coupling layer is configured for thermal coupling to said heat sink,
at least one switch comprising at least one transistor and at least one anti-parallel diode, wherein said at least one switch is mounted on said electrically conductive pattern;
a housing encasing said substrate and said at least one switch,
a laminar interconnect comprising a first electrically conductive layer, an insulating layer and a second electrically conductive layer, wherein said insulating layer is disposed between said first and second electrically conductive layers, wherein said first electrically conductive layer of said laminar interconnect is electrically connected to said upper layer of said substrate, and
a plurality of electrical connections connecting an anode of said anti-parallel diode to said second electrically conductive layer of said laminar interconnect,
said modular three phase inverter assembly further comprising:
a plurality of receptacles configured to receive respective ones of said laminar interconnects; and
a back plane comprising a positive direct current (DC) bus layer, an output layer, and a negative DC bus layer, wherein said receptacles are mounted on said back plane, wherein said power modules are arranged in three pairs, and wherein each of the pairs corresponds to a phase leg.

26. The modular three phase inverter assembly of claim 25, wherein each of said heat sinks comprises a base plate, and wherein said power modules forming a pair are stacked together such that said base plate of one of said power modules faces said base plate of the other of said power modules.

27. The modular three phase inverter assembly of claim 25, further comprising at least one low-inductance capacitor selected from the group consisting of a multilayer ceramic capacitor and a film capacitor, wherein said at least one low inductance capacitor is mounted on a back side of said back plane.

* * * * *